(12) United States Patent
Yagi

(10) Patent No.: US 7,791,514 B2
(45) Date of Patent: Sep. 7, 2010

(54) DIGITAL-TO-ANALOG CONVERTER HAVING CONSTANT CURRENT CELLS PRODUCING EVEN CONSTANT CURRENTS

(75) Inventor: Katsuyoshi Yagi, Kanagawa (JP)

(73) Assignee: Oki Semiconductor Co., Ltd. (JP)

( * ) Notice: Subject to any disclaimer, the term of this patent is extended or adjusted under 35 U.S.C. 154(b) by 61 days.

(21) Appl. No.: 12/352,893

(22) Filed: Jan. 13, 2009

(65) Prior Publication Data

US 2009/0179784 A1    Jul. 16, 2009

(30) Foreign Application Priority Data

Jan. 16, 2008   (JP)   ............................. 2008-006463

(51) Int. Cl.
   *H03M 1/66* (2006.01)
   *H01L 23/48* (2006.01)
(52) U.S. Cl. ....................... 341/136; 257/357
(58) Field of Classification Search ................. 341/136, 341/144; 257/315, 320, 356, 357; 438/201
   See application file for complete search history.

(56) References Cited

U.S. PATENT DOCUMENTS

| | | | |
|---|---|---|---|
| 6,274,921 B1 | 8/2001 | Hasegawa | |
| 6,292,927 B1 * | 9/2001 | Gopisetty et al. | .... 257/E23.142 |
| 6,295,012 B1 * | 9/2001 | Greig | ......................... 341/136 |
| 6,309,972 B1 * | 10/2001 | Pio | ............................. 438/689 |
| 6,337,644 B1 | 1/2002 | Kasahara | |
| 6,683,351 B2 * | 1/2004 | Morita et al. | ................ 257/355 |
| 7,196,369 B2 * | 3/2007 | Chou et al. | .................. 257/315 |
| 2005/0111153 A1 * | 5/2005 | Kitagawa | ..................... 361/91.1 |
| 2007/0264804 A1 * | 11/2007 | Gallia et al. | ................. 438/479 |
| 2009/0080132 A1 * | 3/2009 | Ng et al. | ...................... 361/112 |

FOREIGN PATENT DOCUMENTS

| | | |
|---|---|---|
| JP | 8-181284 A | 7/1996 |
| JP | 11-186508 A | 7/1999 |
| JP | 11-204767 A | 7/1999 |
| JP | 11-239059 A | 8/1999 |
| WO | 99-67884 A1 | 12/1999 |

OTHER PUBLICATIONS

Japanese Office Action "Notification of Reason for Refusal" with mailing date of Nov. 10, 2009; Patent Application No. 2008-006463; with transaltion.

* cited by examiner

*Primary Examiner*—Howard Williams
(74) *Attorney, Agent, or Firm*—Studebaker & Brackett PC; Donald R. Studebaker

(57) ABSTRACT

A digital-to-analog converter includes MOS transistors formed in the identical configuration and arranged in a matrix array. Ones of the MOS transistors placed on the inner part of the array serve as constant current cells, while others placed around the inner MOS transistors function as dummy transistors and a MOS capacitance. Each dummy transistor has its gate, source and drain electrodes connected to a metal strip to which the gate electrode of each constant current cells is connected. Thus, the gate electrodes of the constant current cells are connected to a substrate or potential well via diodes consisting of the dummy transistors, thereby electric charges generated in metal strips due to plasma etching and like treatment being discharged through the diodes to the substrate or potential well. The digital-to-analog converter is thus able to produce even constant currents.

11 Claims, 6 Drawing Sheets

PRIOR ART

PRIOR ART

DIGITAL-TO-ANALOG CONVERTER HAVING CONSTANT CURRENT CELLS PRODUCING EVEN CONSTANT CURRENTS

BACKGROUND OF THE INVENTION

1. Field of the Invention

The present invention relates to a current cell type of digital-to-analog converter, in particular, to such a converter having a group of constant current cells producing even constant currents therebetween in dependent upon a digital signal.

2. Description of the Background Art

Reference will be made to FIGS. 2 to 5 for describing a conventional current cell type of digital-to-analog converter for better understanding the present invention. FIG. 2 is a schematic block diagram showing a conventional current cell type of digital-to-analog converter 100, which comprises a constant current cell group 2 having a plurality of constant current cells arranged in a matrix array for delivering constant currents in accordance with a bias voltage VB applied from a bias voltage generator 1, a switch group 3 having a plurality of switches for differentially selecting the currents output from the constant current cells to thereby output the selected currents, a switch controller 4 for controlling the switches of switch group 3 in response to an input digital signal DS, and a current-to-voltage converter 5 for converting the currents output from the switch group 3 to a corresponding analog voltage AV.

FIG. 3 is a schematic circuit diagram showing an example of conventional constant current cell group and switch group for use in such a current cell type of digital-to-analog converter. In the following, like structural parts or elements will be designated by identical reference numerals, and not repetitively be described in order to avoid redundancy.

In FIG. 3, the constant current cell group 2 comprises a plurality of constant current cells U, a MOS (Metal-Oxide Semiconductor) capacitance C and dummy transistors D. Each of the constant current cells U consists of a MOS transistor, which has its source electrode connected in common to a power supply voltage VDD and its gate electrode connected in common to be supplied with a common bias voltage VB, thereby allowing its drain electrode to output a constant current in dependent upon the bias voltage VB. The MOS capacitance C consists of a MOS transistor which has its source and drain electrodes connected to the power supply voltage VDD, and its gate electrode connected in common to the gate electrode of the constant current cells U. The MOS capacitance C has its gate capacitance thus inserted between the gate electrode of the constant current cells U and the power supply voltage VDD to thereby prevent the gate potential on the constant current cells U from varying. The dummy transistors D consist of unused MOS transistors placed around the constant current cells U, which will be described later.

The switch group 3 comprises a plurality of switches SW which correspondingly interconnected to the constant current cells U of the constant current cell group 2. Each switch SW comprises a first and a second MOS transistor which are interconnected so as to have the conduction state thereof controllable complementarily therebetween in response to control signals CON fed separately from each other by the switch controller 4, FIG. 2. The first and second MOS transistors of each switch SW have the source electrode thereof connected to the drain electrode of the corresponding constant current cell U. Also, the first and second MOS transistors of each switch SW have their drain electrodes connected in common to nodes N1 and N2, respectively. The sum of the currents flowing through the first MOS transistors and the sum of the current flowing the second MOS transistors of the entire switches SW are respectively supplied from the nodes N1 and N2 to the current-to-voltage converter 5.

Now, FIG. 4 schematically shows an example of layout of the constant current cell group 2 shown in FIGS. 2 and 3, more specifically, shows how the electrodes of the constant current cells, the MOS capacitances and the dummy transistors are formed and structured.

In FIG. 4, the constant current cells U, the MOS capacitances C and the dummy transistors D of the constant current cell group 2 consist of the MOS transistors formed in the identical configuration and are arranged in a matrix array as illustrated in the figures. In the illustrative example, the MOS capacitances C are formed in the left two rows in the figure, and on the right of the MOS capacitances C, the constant current cells U and the dummy transistors D are formed. The constant current cells U are arranged on the inner part of the matrix array and surrounded by the dummy transistors D.

The dummy transistors D are adapted to equalize the properties of the constant current cells U arranged inward with respect to the dummy transistors. That is to say, in manufacturing process of the MOS transistors of the identical configuration arranged in the matrix array, small differences in diffusion concentration and temperature distribution of, e.g. process gas used may cause slight difference in size between the gate electrodes formed in the MOS transistors disposed on the inner part where the array pattern thereof is dense and the MOS transistors on the peripheral part where the array pattern is sparse, thereby causing a difference in their properties. Thus, the MOS transistors on the peripheral part are disposed as the dummy transistors D which are never utilized whereas the MOS transistors on the inner part of the matrix will be made active to be served as the constant current cells U so as to supply constant currents uniform between the cells U.

FIG. 5 is an enlarged, conceptual view of apart enclosed in FIG. 4 with the chain-lined rectangle A. As shown in FIG. 5, the constant current cells U have the gate electrodes connected via contact pads to metal strips M1 to which the common bias voltage VB is applied, source electrodes connected via a contact pad to the power supply voltage VDD and drain electrodes connected through a contact pad to the corresponding switches SW of the switch group. In FIG. 5, wirings for the power supply voltage VDD and the switches SW are not shown.

The MOS capacitance C have their gate electrodes connected to the metal strips M1 through contact pads, while having their source and drain electrodes connected via contact pads to the power supply voltage VDD. It is to be noted that source, gate and drain electrodes of the dummy transistors D have no electrical connections.

In such a current cell type of digital-to-analog converter, each constant current cell U of the constant current cell group 2 produces stable and even current to supply it to the switch SW of the switch group 3 corresponding to the cell. In each switch SW of the switch group 3, the first or second MOS transistor of the switch SW is turned on by the control signal CON output from the switch controller 4 in response to a digital signal DS, whereby each switch SW carries a constant current fed from each constant current cell U regardless of the presence or absence of the control signal CON. The currents passing through the first and second MOS transistors in each switch SW are added up at the nodes N1 and N2, respectively, so that the sums of the currents are delivered to the current-to-voltage converter 5.

When the group of switches 2 includes m switches SW in total, where m is a natural number more than unity, and one or ones (n) of the m switches SW has/have the first MOS transistors turned ON, the total amount of currents flowing from the first MOS transistors of the switch group 3 to the node N1 is n times as much as the constant currents passing through the constant current cells U. Furthermore, the total amount of currents flowing from the second MOS transistors of the switch group 3 to the node N2 is (m−n) times as much as the constant currents passing through the constant current cells U. The currents sent out from the nodes N1 and N2 of the switch group 3 are converted to analog voltage outputs AV by the current-to-voltage converter 5 and output therefrom.

In the cell type of digital-to-analog converter, ones of the MOS transistors arranged in the periphery of the matrix array is rendered as unused dummy transistors and the MOS transistors on the inner part of the array serve as the constant current cells U. In addition, MOS transistors identical in configuration to the transistors U have the source and drain electrodes connected to the power supply voltage VDD, and the gate electrode connected to the gate electrodes of the constant current cells U so as to function as the MOS capacitances C. Therefore, the bias voltage VB can be stable, and thereby more even and stable constant current can be output. Accordingly, the digital-to-analog converter can supply an analog voltage AV with higher accuracy. Such a cell type of digital-to-analog converter is disclosed, for example, by Japanese patent laid-open publication No. 239059/1999.

However, the constant current cell group 2 of the current cell type of digital-to-analog converter involves such a drawback, specifically, that the gate electrodes of the constant current cells U of the constant current cell group 2 remain isolated, during the manufacturing process, from the semiconductor substrate or potential well. If, under such circumstances, the gate electrodes are made connected through the contact pads to the metal strip M1 and further processed by, e.g. plasma etching, then the electric charges thus injected are concentrated on the metal strips M1 or the equivalent to render the electric charges applied to the gate electrodes of the constant current cells U, that is so-called antenna effect. The antenna effect increases in proportion to an antenna ratio, i.e. the ratio of the metal wiring area connected to the gate region to the area of the gate region, thereby more deteriorating the gate insulating layer. Since the antenna ratio varies according to where the constant current cells U are arranged, the gate insulating layers of the constant current cells U are not evenly deteriorated. Consequently, the threshold voltage and drain current differ in magnitude constant current cell U by cell, thus rendering it difficult to produce constant currents which are even between the cells U.

SUMMARY OF THE INVENTION

It is therefore an object of the present invention to provide a digital-to-analog converter having constant current cells that enable to produce even constant currents.

In accordance with the present invention, a digital-to-analog converter having constant current cells that produce even constant currents by suppressing an antenna effect during its manufacturing process. Specifically, in accordance with the invention, a digital-to-analog converter comprises a constant current cell group having a plurality of constant current cells for outputting substantially identical constant currents; a switch group having a plurality of switches, each of which is provided correspondingly to different one of the constant current cells and operative in response to a control signal for outputting a current passing through the corresponding constant current cell to a first or a second node; a switch controller for decoding an input digital signal to produce the control signal; and a current-to-voltage converter for converting the currents passing through the first and second nodes to a corresponding analog voltage to output the converted voltage.

More specifically, the constant current cell group of the invention includes a plurality of dummy transistors consisting of MOS transistors formed in the configuration substantially identical with the constant current cells and placed around the constant current cells, and a plurality of MOS capacitances consisting of MOS transistors formed in the substantially identical configuration with the constant current cells and placed adjacent to some of the dummy transistors, as well as the constant current cells consisting of MOS transistors formed in the substantially identical configuration and arranged in a matrix array.

Moreover, the constant current cells have their gate electrodes connected to a first wiring layer to which a common bias voltage is applied, their source electrodes connected to a second wiring layer to which a common power supply voltage is applied, and their drain electrodes connected to the corresponding switches. Furthermore, the dummy transistors have their gate, source and drain electrodes connected to the first wiring layer, and the MOS capacitances have their gate electrodes connected to the first wiring layer, while having their source and drain electrodes connected to the second wiring layer.

In accordance with the present invention, the gate, source and drain electrodes of the unused dummy transistors placed around the constant current cells are connected to the first wiring layer, to which the common bias voltage is applied, so as to function as dummy transistors in order to make uniform the properties of the constant current cells placed on the inner part of the matrix array.

Through the first wiring layer, the source and drain electrodes of the dummy transistors are connected to the gate electrodes of the constant current cells. The source and drain electrodes of the dummy transistors are connected to source diffusion layers and drain diffusion layers formed on the semiconductor substrate or potential well, respectively, and diodes are established by the PN-junction formed between the source or drain diffusion layer and the substrate or potential well. The dummy transistors, therefore, act as diodes connected between the first wiring layers and the substrate or potential well.

Since the gate electrodes of the constant current cells are connected to the first wiring layers, when plasma etching, for instance, is conducted during manufacturing process, the electric charges accumulated on the first wiring layer are discharged to, e.g. the substrate by the dummy transistors working as diodes. Consequently, the electric charges do not gather to the gate electrodes of the constant current cells, so that the deterioration of the gate insulating layer otherwise caused by the antenna effect can be reduced. Accordingly, the antenna effect otherwise caused during the manufacturing process is suppressed, thereby providing a current-to-voltage converter having constant current cells that can produce even constant currents.

BRIEF DESCRIPTION OF THE DRAWINGS

The objects and features of the present invention will become more apparent from consideration of the following detailed description taken in conjunction with the accompanying drawings in which.

DESCRIPTION OF THE PREFERRED EMBODIMENTS

Figure 1:
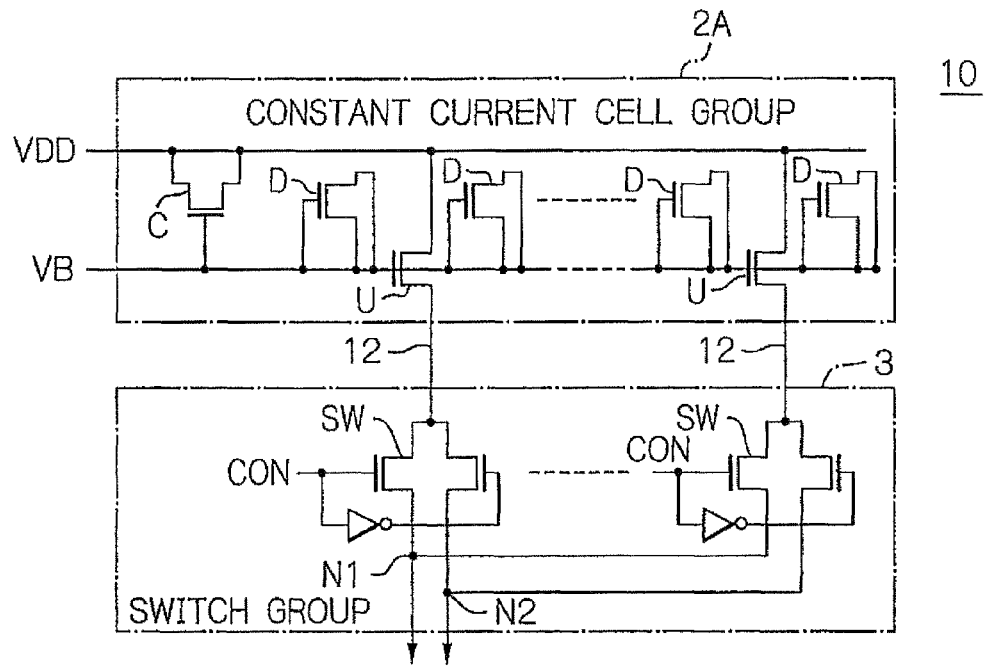
FIG. 1 is a schematic block diagram showing a constant current cell group and a switch group included in an illustrative embodiment of a current cell type of digital-to-analog converter accordance to the present invention.

With reference to the accompanying drawings, a preferred embodiment of the digital-to-analog converter according to the present invention will be described in detail. FIG. 1 shows the configurations of a constant current cell group 2A and a switch group 3 included in a digital-to-analog converter 10 of a preferred embodiment of the invention. In the figures, like structural parts or elements are designated by identical reference numerals, and will not repetitively be described in order to avoid redundancy. The configurations of the switch group and other elements constituting the digital-to-analog converter of the invention are not specifically limited to those of the preferred embodiments.

Figure 2:
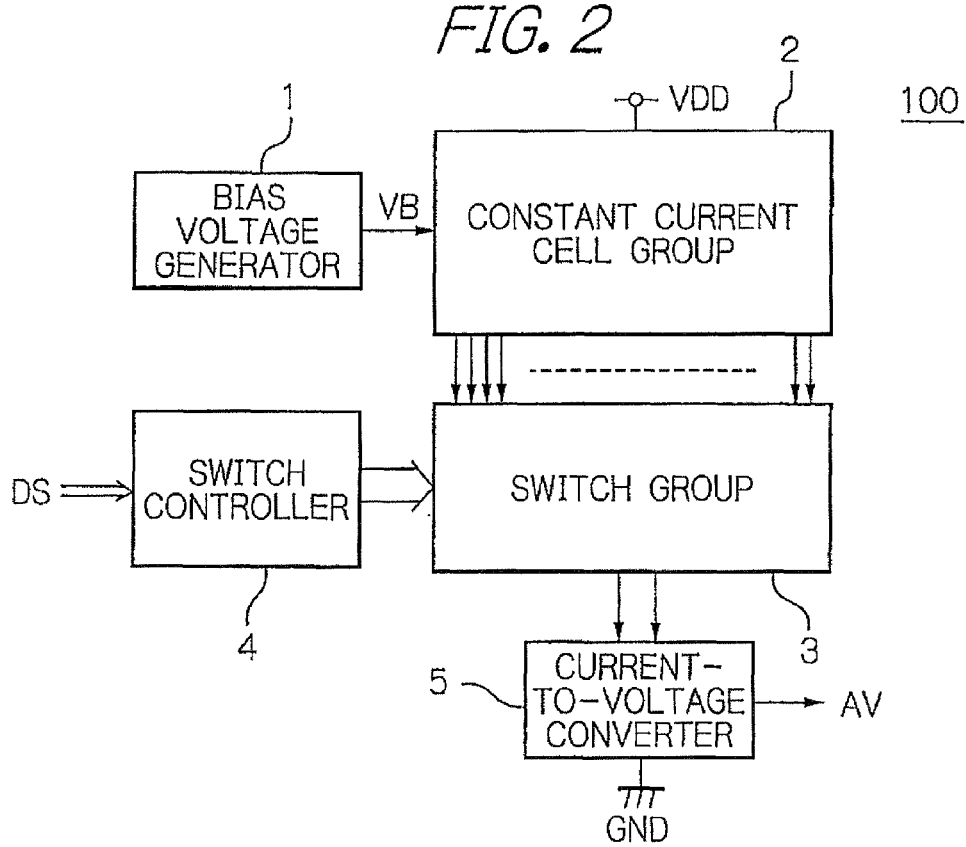
FIG. 2 is a schematic block diagram showing a conventional current cell type of digital-to-analog converter to be compared with the current cell type digital-to-analog converter according to the present invention.
Figure 3:
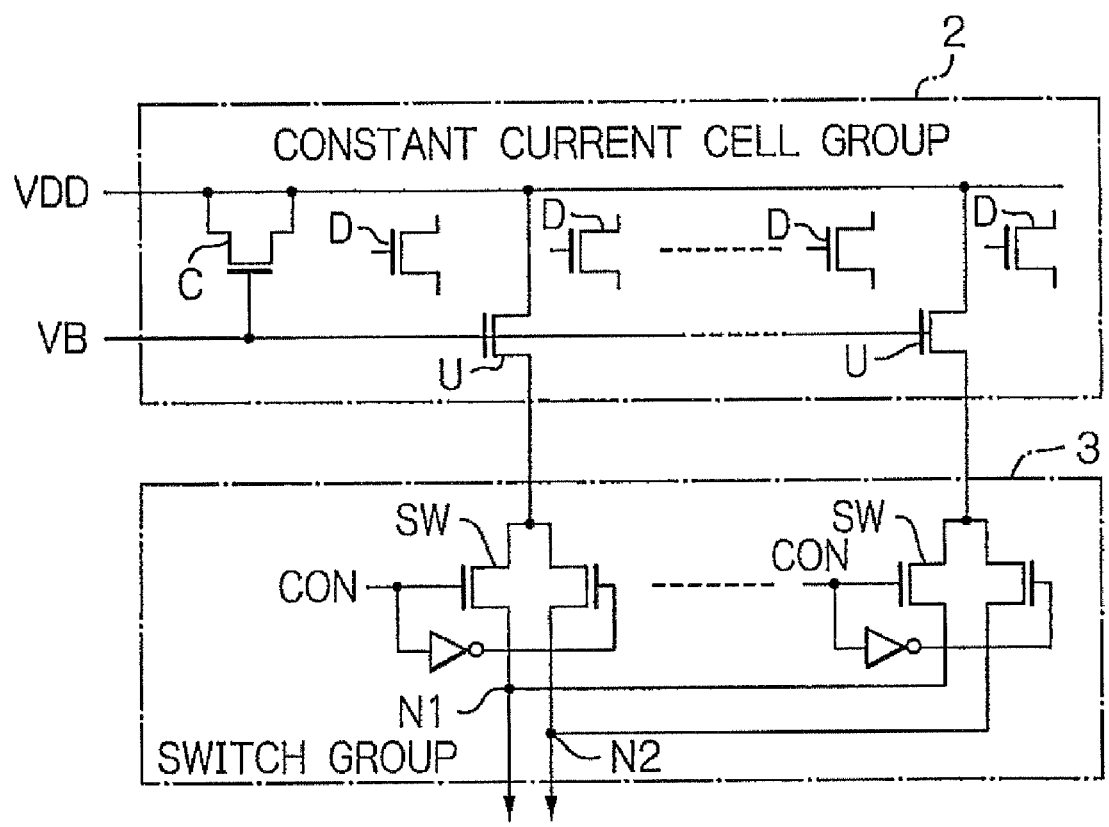
FIG. 3 is a schematic circuit diagram showing an example of constant current cell group and switch group in the conventional current cell type of digital-to-analog converter.
Figure 4:
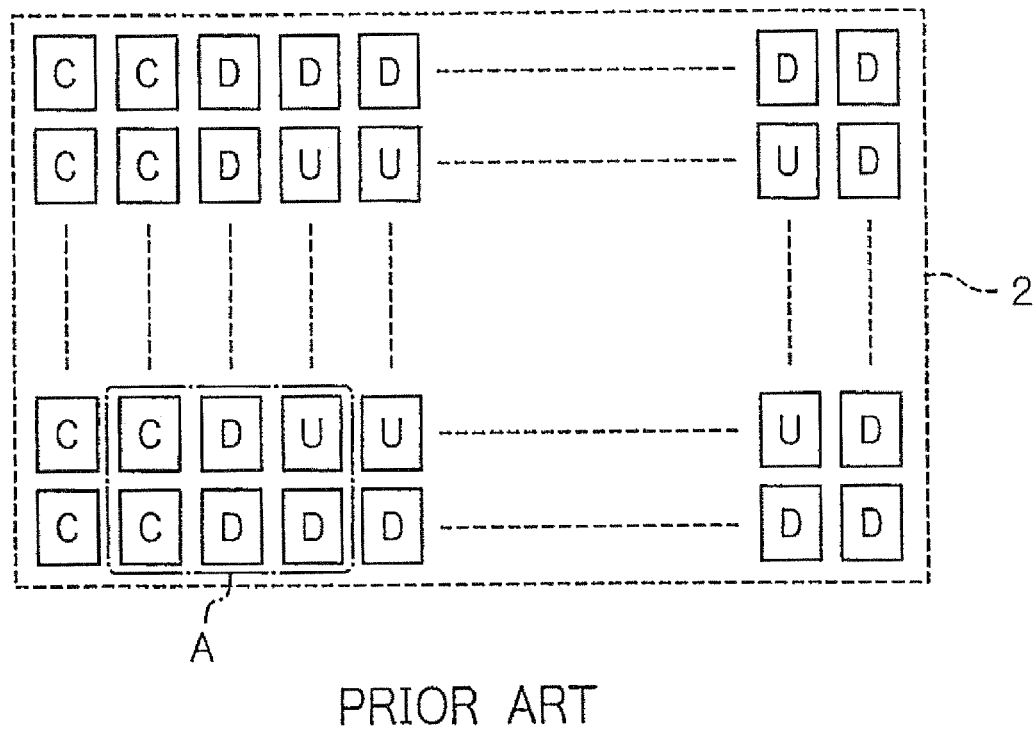
FIG. 4 schematically shows in a plan view an example of layout of the constant current cell group shown in FIG. 3.
Figure 5:
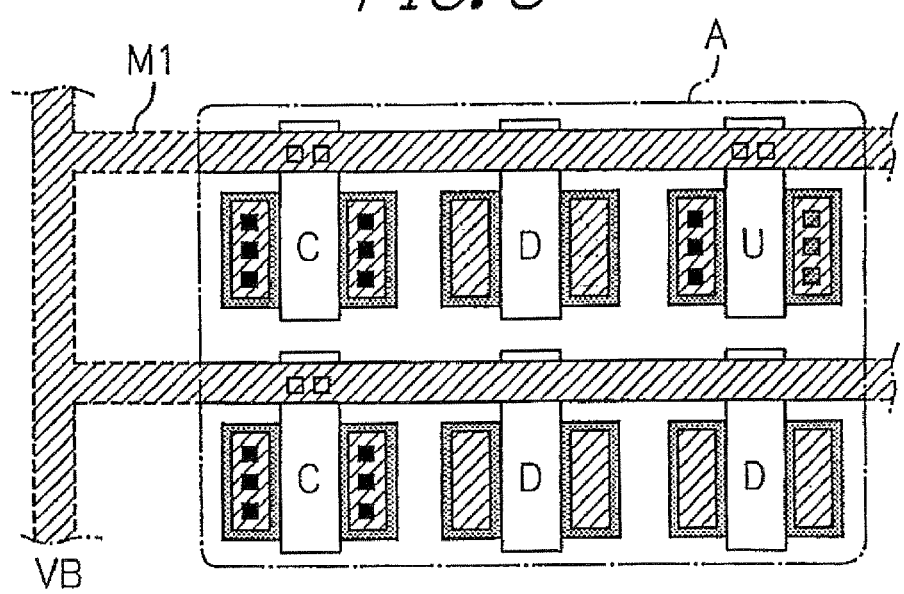
FIG. 5 is an enlarged, conceptual view of a part enclosed with the chain-lined rectangle A in FIG. 4.

In FIG. 1, the digital-to-analog converter 10 according to the present invention comprises a constant current cell group 2A instead of the constant current cell group 2 shown in FIGS. 2 and 3, as well as the switch group 3. Of course, the digital-to-analog converter 10 also comprises a bias voltage generator, a switch controller and a current-to-voltage converter which may substantially be the same as the bias voltage generator 1, the switch controller 4 and the current-to-voltage converter 5, respectively, shown in FIG. 2, and therefore will not further be shown and described in order to avoid redundancy. In general sense, it can be said that the constant current cell group 2A and the switch group 3 may function as the constant current cell group 2 and the switch group 3 in a general current cell type digital-to-analog converter as illustrated in FIG. 2.

The constant current cell group 2A comprises, as shown in FIG. 1, a plurality of constant current cells U, a MOS capacitance C and dummy transistors D. The constant current cells U consist of MOS transistors, which have their source electrodes connected in common to a power supply voltage VDD and their gate electrodes connected to be supplied with a common bias voltage VB, thereby allowing the drain electrodes 12 of the cells U to output constant currents in dependent upon the bias voltage VB. Signals are designated with reference numerals on connections conveying the signals.

The MOS capacitance C consists of a MOS transistor which has its source and drain electrodes connected to the power supply voltage VDD and its gate electrode connected in common to the gate electrodes of the constant current cells U. Thus, the gate capacitance of the MOS transistor C is inserted between the gate electrodes of the constant current cells U and the power supply voltage VDD, thereby preventing the gate potential on the constant current cells U from varying.

The dummy transistors D consist of MOS transistors arranged around the constant current cells U on one of the primary surfaces of a semiconductor substrate SUB, which will be described later with reference to FIGS. 6-9. The MOS transistors have their gate, source and drain electrodes connected together to the gate electrode of the constant current cells U so as to act as protective diodes, although the dummy transistors D are not directly involved in the operation of producing regulated currents.

Note that, as will be described with reference to FIG. 6, the current cell type digital-to-analog converter 10 has two rows of MOS transistors arranged in a matrix array in the constant current cell group 2A functioning as MOS capacitances C. However, the number of MOS transistors serving as capacitances C is not restricted to that of the specific embodiment, but any number of transistors may be used that can provide MOS capacitance which does not cause the gate voltage to vary at the gate electrodes of the constant current cells U.

In FIG. 1, the switch group 3 comprises, as with the one shown in FIG. 3, a plurality of switches SW correspondingly to the constant current cells U of the constant current cell group 2A. Each switch SW comprises a first and a second MOS transistor, whose conduction states are controlled complementarily to each other in response to a control signal CON fed from a switch controller 4 which may be the same as shown in FIG. 2. The MOS transistors of each switch SW have their source electrodes connected to the drain electrodes 12 of corresponding one of the constant current cells U. Furthermore, the first and second MOS transistors of each switch SW have their drain electrodes connected in common to nodes N1 and N2, respectively. The sum of the currents passing through the respective first and second MOS transistors of each switch SW are supplied via the nodes N1 and N2, respectively, to a current-to-voltage converter 5 which may also be the same as shown in FIG. 2.

Figure 6:
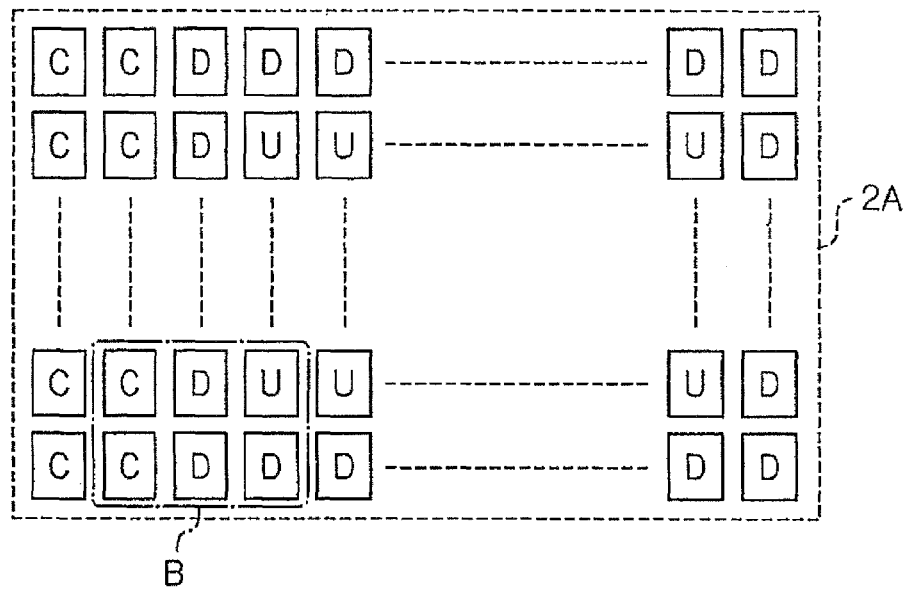
FIG. 6 is a schematic plan view of an example of layout of the constant current cell group shown in FIG. 1.

FIG. 6 is a schematic plan view of an example of layout of the constant current cell group 2A shown in FIG. 1. The constant current cell group 2A comprises the constant current cells U, the MOS capacitances C and the dummy transistors D, all of which consist of MOS transistors having the configuration substantially identical to each other, and are arranged in a matrix array as illustrated in the figure. More specifically, the MOS capacitances C are placed in the left two rows in the figure, and on the right of the MOS capacitances C, the constant current cells U and the dummy transistors D are placed. As seen from the figure, the constant current cells U are arranged on the inner part of the matrix array, surrounded by the dummy transistors D.

The dummy transistors D are adapted to equalize the properties of the constant current cells U arranged inward with respect to the dummy transistors. Generally, the MOS transistors having such identical configuration and arranged in the matrix array may suffer from a difference in their properties due to small differences in diffusion concentration and temperature distribution of, e.g. process gas used in the manufacturing process, thus causing a slight difference in size between the gate electrodes of the MOS transistors formed on the inner part where the array pattern is dense and those on the peripheral part where the array pattern is sparse in accordance with the invention, however, the MOS transistors functioning as the dummy transistors D are disposed on the peripheral part, while the MOS transistors functioning as the constant current cells U are disposed on the inner part of the matrix so as to produce constant currents which are substantially even therebetween.

Figure 7:
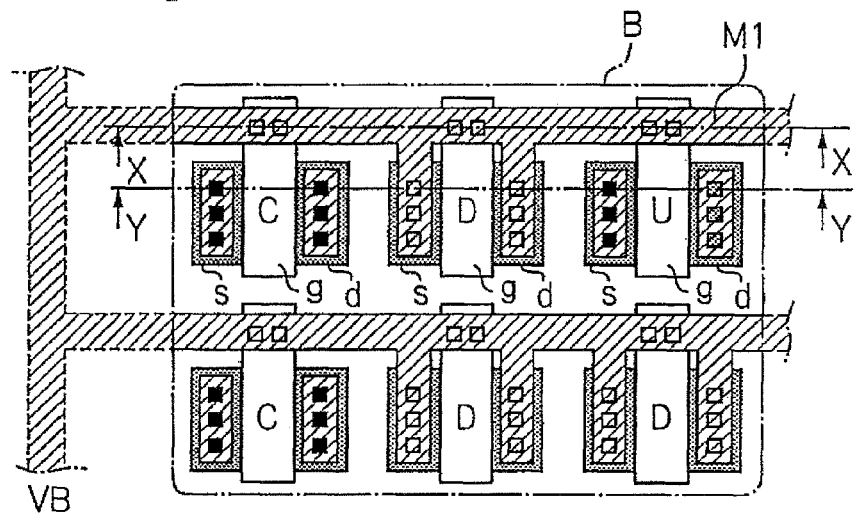
FIG. 7 is an enlarged, conceptual view of a part enclosed with the chain-lined rectangle B in FIG. 6.
Figure 8:
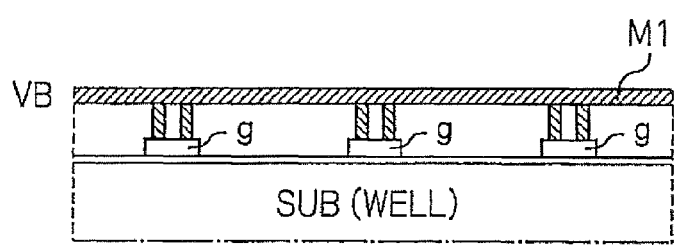
FIG. 8 is an enlarged, conceptual cross-sectional view of a part cut along the dotted line X-X in FIG. 7.

FIG. 7 is an enlarged, conceptual view of a part enclosed with the chain-lined rectangle B shown in FIG. 6 and shows how the electrodes of the constant current cells U, the MOS capacitances C and the dummy transistors D are physically structured and interconnected. FIG. 8 is an enlarged, conceptual cross-sectional view of a part cut along the dotted line X-X in FIG. 7, and FIG. 9 is also an enlarged, conceptual cross-sectional view of a part cut along the dotted line Y-Y in FIG. 7.

Figure 9:
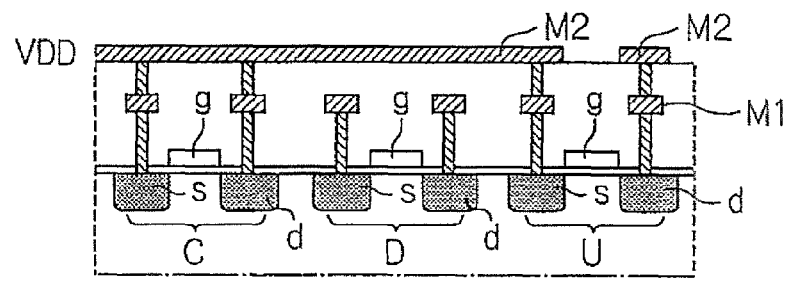
FIG. 9 is an enlarged, conceptual cross-sectional view of a part cut along the dotted line Y-Y in FIG. 7.

In FIGS. 7, 8 and 9, the constant current cells U have a gate electrode g, a source electrode s and a drain electrode d. The gate electrodes g are connected via contact pads to metal strips M1 to which the common bias voltage VB is to be applied, the source electrodes s being connected via contact pads to the power supply voltage VDD, while the drain electrodes d being connected through contact pads to the corresponding switches SW of the switch group. In the figures, connections to the switches SW are not shown. The MOS capacitances C have their gate electrodes g connected to the metal strips M1 through contact pads, while having their source electrodes s and drain electrodes d connected via contact pads to metal strips M2, thus to the power supply voltage VDD.

Now, the dummy transistors D have their source electrodes s, gate electrodes g and drain electrodes d connected to the metal strips M1 through contact pads. Consequently, each dummy transistor D serves as a diode established by the PN junction formed between, e.g. the P-type source or drain diffusion layer formed on a semiconductor substrate SUB or over a potential well WELL and the N-type substrate SUB or potential well WELL. Note that the conductivity type of those regions such as the substrate SUB and potential well WELL are not limited to specific ones of the preferred embodiments.

In the manufacturing process of the constant current cell group 2A, a plurality of MOS transistors is formed in a matrix array, and the metal strips M1 are then formed to which the gate electrodes of the constant current cells U and the MOS capacitances C as well as the drain, source and gate electrodes of the dummy transistors D are connected through the contact pads. At this time, the gate electrodes of the constant current cells U are connected to the drain and source electrodes of the dummy transistors D over the metal strips M1 and further to the substrate SUB or potential well WELL through the diodes of the dummy transistors D.

In the subsequent manufacturing process, when treatment such as plasma etching is performed, electric charges acquired by virtual antennas effected from the metal strips M1 are discharged to, e.g. the substrate by the dummy transistors D which serve as the diodes stated above. The electric charges, therefore, do not gather on the gate electrodes of the constant current cells U, thereby retarding deterioration of the gate insulating layer otherwise caused by the antenna effect. Consequently, the antenna effect otherwise caused during the manufacturing processes can be suppressed, and thus the constant current cell group 2A can be formed which enable constant currents to be evenly developed.

Of course, the configuration of the current cell type digital-to-analog converter 10 shown in FIGS. 1 and 6-9 is only illustrative and may be changed or modified, as desired. For example, in the current cell type digital-to-analog converter 10, the conventional dummy transistors are wired such that they can act as diodes for suppressing the antenna effect. Alternatively, diodes dedicated to antenna-effect suppression may be provided in addition to the conventional dummy transistors. The digital-to-analog converter 10 has all dummy transistors D wired so as to serve as diodes for suppressing the antenna effect. However, not all of the dummy transistors D necessarily have diode connections, but some of them may sufficiently have such diode connections, thus possibly suppressing the antenna effect.

The current cell type digital-to-analog converter 10 of the invention having a group of constant current cells, such 2A, may act as a digital-to-analog converter in a conventional manner. That is, each constant current cell U of the constant current cell group 2A produces stable, even current and supplies it to the corresponding switch SW of the switch group 3. In each switch SW of the switch group 3, the first or second MOS transistor of the switch SW is alternatively turned on by the control signal CON which is output from the switch controller 4, FIG. 2, in response to the digital signal DS. That allows a constant current fed from each constant current cell U to pass corresponding switch SW without depending upon the logical state of the control signal CON. The currents passing through either of the first and second MOS transistors in the respective switches SW are added together at the nodes N1 and N2, respectively, and are delivered to the current-to-voltage converter 5, which may be of the type shown in FIG. 2.

When the switch group 3 includes a plurality (m) of switches SW in total, where m is a natural number more than unity, and one or ones (n) of the switches SW has/have the first MOS transistors turned ON or conductive, the total amount of currents flowing from the first MOS transistors of the switch group 3 to the node N1 is n times as much as the constant currents passing through the constant current cells U. The total amount of currents flowing from the second MOS transistors of the switch group 3 to the node N2 is (m−n) times as much as the constant currents passing through the constant current cells U. The currents conducted out from the nodes N1 and N2 of the switch group 3 are converted to corresponding analog voltage outputs AV by the current-to-voltage converter 5 to be output.

As described above, in accordance with the constant current cell group 2A in the illustrative embodiment, ones of the MOS transistors arranged in the peripheral region of the matrix array are wired to function as the dummy transistors D for suppressing the antenna effect, and the MOS transistors on the inner part of the array are used for the constant current cells U with the MOS transistors, having substantially the same shape or configuration as the cells U, connected to the gate electrodes of the constant current cells U so as to serve as the MOS capacitances. Therefore, in addition to the advantages in the conventional art that the properties of the constant current cells U can be equal to each other, thereby making the bias voltage VB stable, another advantage can be achieved that the damage to the gate insulating film of the constant current cells U otherwise caused by the antenna effect during the manufacturing process is minimized so that it is possible to produce more even and stable constant currents. Accordingly, the use of the constant current cell group such as 2A enables to provide a digital-to-analog converter capable of producing an analog voltage AV with higher accuracy.

Figure 10:
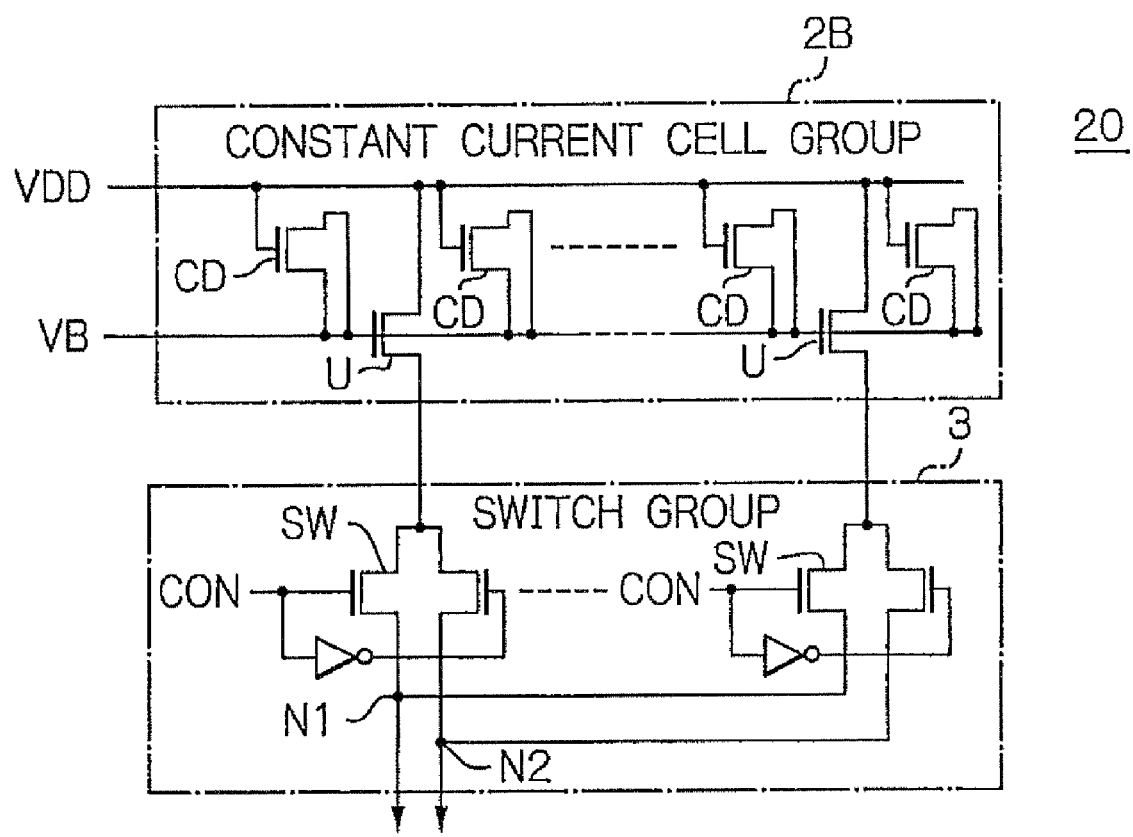
FIG. 10 is a schematic block diagram showing a constant current cell group and a switch group included in an alternative embodiment of a current cell type of digital-to-analog converter accordance to the present invention.

Well, reference will be made to FIG. 10 for describing an alternative, specific current cell type of digital-to-analog conversion 20 according to the invention. FIG. 10 schematically shows the configurations of a constant current cell group 2B and the switch group 3 of the alternative preferred embodiment. It is to be noted that the constant current cell group 2B and the switch group 3 can be used in place of the constant current cell group 2 and the switch group 3, respectively, in the general current cell type digital-to-analog converter as illustrated in FIG. 2.

The constant current cell group 2B comprises, as shown in FIG. 10, the plurality of constant current cells U as with the cells U shown in FIG. 1 and dummy transistors CD having its function corresponding to that of both MOS capacitance C and dummy transistor D shown in FIG. 1.

The dummy transistors CD consist of MOS transistors placed around the constant current cells U on the semiconductor substrate as with the dummy transistors D shown in FIG. 1. The dummy transistors CD serve as MCS capacitances inserted between the gate electrodes of the constant current cells U and the power supply voltage VDD so as to control the variation of gate potential across the constant current cells U during operation while serving as protective diodes of the gate electrodes of the constant current cells U in the manufacturing process of the device. More specifically, the dummy transistors CD have their gate electrodes connected to the power supply voltage VDD, while having their source and drain electrodes connected to the gate electrodes of the constant current cells U.

Figure 11:
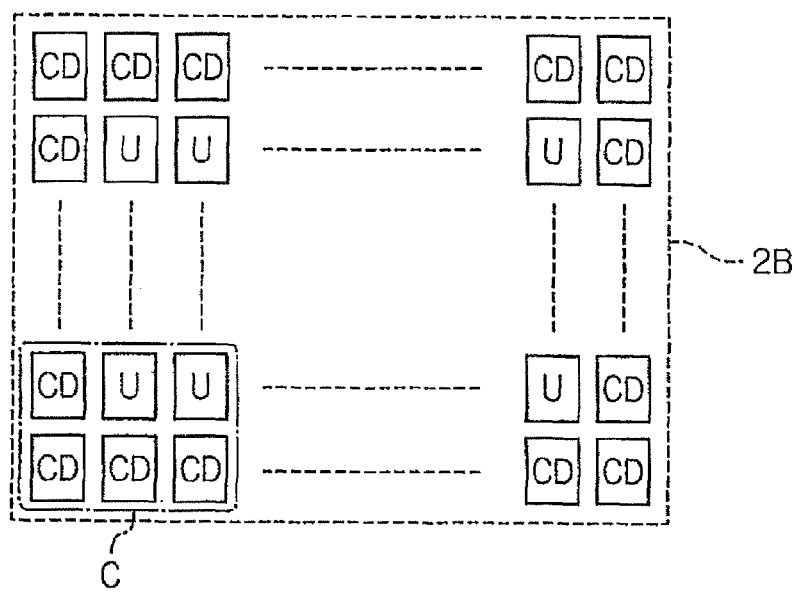
FIG. 11 is a schematic plan view of an example of layout of the constant current cell group shown in FIG. 10.

FIG. 11 schematically shows in a plan view an example of layout of the constant current cell group 2B shown in FIG. 10. The constant current cell group 2B comprises the constant current cells U and the dummy transistors CD, all of which consist of MOS transistors having the configuration substantially identical to each other, and are arranged in a matrix array as illustrated in the figure. In the alternative embodiment, the constant current cells U are arranged on the inner part of the matrix, and surrounded by the dummy transistors CD on the substrate.

The dummy transistors CD are thus arranged to surround the constant current cells U on the substrate in order to prevent a difference in the properties of the constant current cells U, the difference being generally caused, depending on where the transistors are located, by small differences in diffusion concentration of, e.g. process gas used in the manufacturing process of the device.

Figure 12:
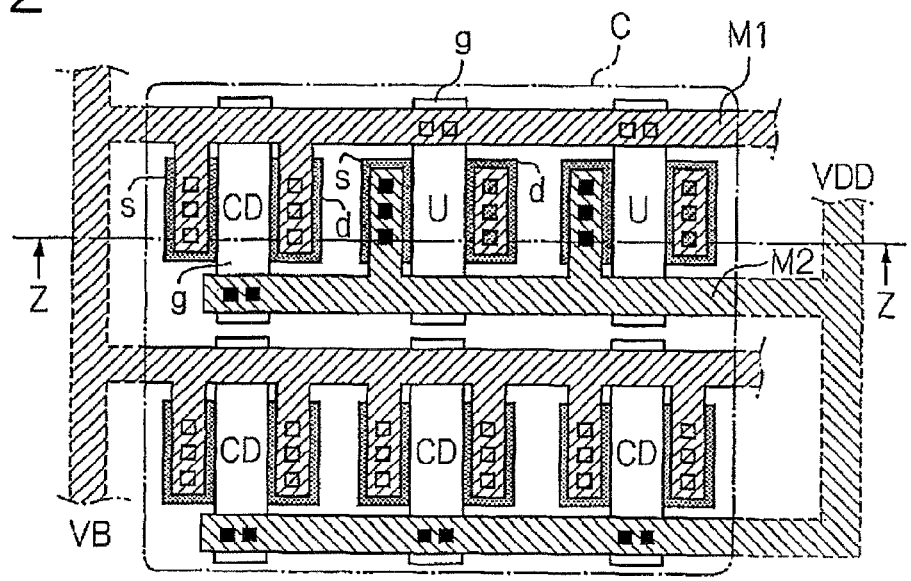
FIG. 12 is an enlarged, conceptual view of a part enclosed with the chain-lined rectangle C shown in FIG. 11.
Figure 13:
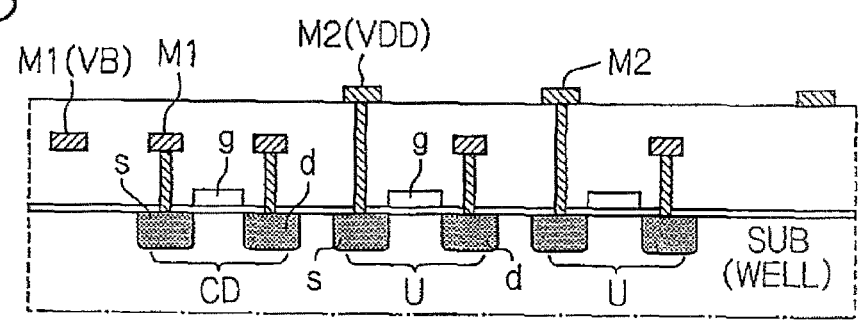
FIG. 13 is an enlarged, conceptual cross-sectional view of a part cut along the dotted line Z-Z in FIG. 12.

FIG. 12 is an enlarged, conceptual view of a part enclosed with the chain-lined rectangle C shown in FIG. 11 and shows how the electrodes of the constant current cells U and the dummy transistors CD are structured and interconnected. FIG. 13 is also an enlarged, conceptual cross-sectional view of a part cut along the dotted line Z-Z in FIG. 12.

The constant current cells U have their gate electrodes g connected via contact pads to metal strips M1 to which the common bias voltage VB is applied, their source electrodes s connected via contact pads to metal strips M2 to which the power supply voltage VDD is applied, and their drain electrodes d connected through contact pads to the corresponding switches SW of the switch group. In the figures, interconnections for the switches SW are not shown.

The dummy transistors CD have their source electrodes s and drain electrodes d connected to the metal strips M1 through contact pads, while having their gate electrodes g connected to the metal strips M2 via contact pads. Consequently, each dummy transistor CD serves as a MOS capacitance connected between the metal strips M1 and M2 as well as serving as a diode established by the PN junction formed between the metal strip M1 and the source or drain diffusion layer formed on the substrate SUB or potential well WELL.

In the manufacturing process of the constant current cell group 2B, how the dummy transistors CD retards deterioration of a gate insulating layer of the constant current cells U may be the same as with the current cell type digital-to-analog converter 10 described earlier. The current cell type digital-to-analog converter 20 having the constant current cell group 2B may also perform digital-to-analog conversion as with the current cell type digital-to-analog converter 10 having the constant current cell group 2A.

In this way, in accordance with the constant current cell group 2B in the current cell type digital-to-analog converter 20, the MOS transistors are arranged in the matrix array such that the MOS transistors on the inner part of the array serve as constant current cells U, while the MOS transistors disposed on the periphery of the former are wired so as to function as the MOS capacitances as well as the diodes for suppressing the antenna effect in manufacturing process. Consequently, in the current cell type digital-to-analog converter 20, it is not necessary to provide the MOS capacitances C separately from the dummy transistors D as in the current cell type digital-to-analog converter 10, thereby offering an advantage in reducing layout area in addition to the advantages of the current cell type digital-to-analog converter 10.

The entire disclosure of Japanese patent application No. 2008-6463 filed on Jan. 16, 2008, including the specification, claims, accompanying drawings and abstract of the disclosure is incorporated herein by reference in its entirety.

While the present invention has been described with reference to the particular illustrative embodiments, it is not to be restricted by the embodiments. It is to be appreciated that those skilled in the art can change or modify the embodiments without departing from the scope and spirit of the present invention.

What is claimed is:

1. A digital-to-analog converter comprising:
   a constant current cell group including a plurality of constant current cells for feeding constant currents which are substantially identical to each other;
   a switch group including a plurality of switches, each of which is provided correspondingly to different one of said plurality of constant current cells and operative in response to a control signal for outputting a current passing through the corresponding constant current cell to a first node or a second node;
   a switch controller for decoding an input digital signal to produce the control signal; and
   a current-to-voltage converter for converting the currents passing through said first and second nodes to a corresponding analog voltage to output the voltage,
   said plurality of constant current cells including a first plurality of MOS (Metal-Oxide Semiconductor) transistors formed in substantially identical configuration and arranged in a matrix array,
   said constant current cell group further including a plurality of dummy transistors including a second plurality of MOS transistors formed in substantially identical configuration with said plurality of constant current cells and placed around said plurality of constant current cells, and a plurality of MOS capacitances including MOS transistors formed in substantially identical configuration with said plurality of constant current cells and placed adjacent to at least one of said plurality of dummy transistors,
   each of said plurality of constant current cells having a gate electrode connected to a first wiring layer to which a common bias voltage is applied, a source electrode connected to a second wiring layer to which a common power supply voltage is applied, and a drain electrode connected to corresponding one of said plurality of switches, at least one of said plurality of dummy transistors having a gate, a source and a drain electrode connected to said first wiring layer, each of said plurality of MOS capacitances having a gate electrode connected to said first wiring layer and a source and a drain electrode connected to said second wiring layer.

2. The digital-to-analog converter in accordance with claim 1, wherein said dummy transistors act as protective diodes.

3. The digital-to-analog converter in accordance with claim 1, wherein said first and second wiring layers are metal strips to which a common bias voltage is applied and metal strips to which a power supply voltage is applied, respectively.

4. The digital-to-analog converter in accordance with claim 1, wherein said dummy transistors serve as diodes to discharge electric charges acquired by vertical antennas effected from the first wiring layer to a conductivity type of substrate or well.

5. The digital-to-analog converter in accordance with claim 4, wherein said dummy transistors serve as diodes established by the PN junction formed between the P-type source or drain diffusion layer formed on a semiconductor substrate or over a potential well and N-type substrate or potential well.

6. The digital-to-analog converter in accordance with claim 4, wherein, over the first wiring layer, said gate electrodes of the constant current cells are connected to the drain and source electrodes of the dummy transistors, and further to a substrate or potential well through the diodes of the dummy transistors.

7. A digital-to-analog converter comprising:
a constant current cell group having a plurality of constant current cells for feeding constant currents which are substantially identical to each other;
a switch group having a plurality of switches, each of which is provided correspondingly to different one of said plurality of constant current cells and operative in response to a control signal for outputting a current passing through the corresponding constant current cell to a first node or a second node;
a switch controller for decoding an input digital signal to produce the control signal; and
a current-to-voltage converter for converting the currents passing through said first and second nodes to a corresponding analog voltage to output the voltage,
said plurality of constant current cells including a first plurality of MOS (Metal-Oxide Semiconductor) transistors formed in substantially identical configuration and arranged in a matrix array,
said constant current cell group further including a plurality of dummy transistors including a second plurality of MOS transistors formed in substantially identical configuration with said plurality of constant current cells and placed around said plurality of constant current cells,
each of said plurality of constant current cells having a gate electrode connected to a first wiring layer to which a common bias voltage is applied, a source electrode connected to a second wiring layer to which a common power supply voltage is applied, and a drain electrode connected to corresponding one of said plurality of switches,
each of said plurality of dummy transistors having a source and a drain electrode connected to the first wiring layer, and a gate electrode connected to the second wiring layer.

8. The digital-to-analog converter in accordance with claim 7, wherein said dummy transistors act as protective diodes.

9. The digital-to-analog converter in accordance with claim 7, wherein said first and second wiring layers are metal strips to which a common bias voltage is applied and metal strips to which a power supply voltage is applied, respectively.

10. The digital-to-analog converter in accordance with claim 7, wherein said dummy transistors serve as diodes to discharge electric charges acquired by vertical antennas effected from the first wiring layer to a conductivity type of substrate or well.

11. The digital-to-analog converter in accordance with claim 10, wherein said dummy transistors serve as diodes established by the PN junction formed between the first wiring layer and a source or drain diffusion layer formed on a substrate or a potential well, and as MOS capacitances connected between said first and second wiring layers.

* * * * *